United States Patent
Chiang (10) Patent No.: US 8,585,911 B2
(45) Date of Patent: Nov. 19, 2013

(54) THIN FILM ANTENNA AND THE METHOD OF FORMING THE SAME

(76) Inventor: Kuo-Ching Chiang, Linkou Township, Taipei County (TW)

( * ) Notice: Subject to any disclaimer, the term of this patent is extended or adjusted under 35 U.S.C. 154(b) by 669 days.

(21) Appl. No.: 12/724,806

(22) Filed: Mar. 16, 2010

(65) Prior Publication Data

US 2010/0237038 A1 Sep. 23, 2010

(30) Foreign Application Priority Data

Mar. 18, 2009 (TW) ................................ 98108820 A
Sep. 22, 2009 (TW) ................................ 98131966 A (51) Int. Cl.
*B44C 1/22* (2006.01)

(52) U.S. Cl.
USPC ................... 216/10; 216/13; 216/52; 216/65; 216/94

(58) Field of Classification Search
USPC ..................... 216/10, 13, 52, 65, 94
See application file for complete search history.

(56) References Cited

U.S. PATENT DOCUMENTS

| | | | |
|---|---|---|---|
| 2004/0200061 A1* | 10/2004 | Coleman et al. | 29/825 |
| 2005/0231371 A1* | 10/2005 | Rowe | 340/572.7 |
| 2007/0226994 A1* | 10/2007 | Wollach et al. | 29/825 |
| 2008/0047130 A1* | 2/2008 | Lin et al. | 29/600 |
| 2009/0285976 A1* | 11/2009 | Lochtman et al. | 427/64 |

\* cited by examiner

*Primary Examiner* — Binh X Tran
(74) *Attorney, Agent, or Firm* — Chih Feng Yeh; Huntington IP Consulting Co. Ltd.

(57) ABSTRACT

The present invention discloses a thin film multi-band antenna, which is formed by PVD-Roll to Roll process and is formed of metal-oxide, conductive polymer, conductive glue or CNT. In another aspect, the present invention discloses a manufacturing method of thin film antenna, comprising preparing gel, followed by coating the gel on a substrate to form a transparent thin film. Thermal process is performed to heat the thin film. The gel includes vinyl oxide and metal compounds, wherein the vinyl oxide includes PEO having In(NO)3.3H2O, In(Ac)3, SnCl2.2H2O, or Sn(C2O4) contained thereof.

12 Claims, 6 Drawing Sheets

Sol-Gel reaction $Si(OR)_4 + H_2O \leftrightarrow HO\text{-}Si(OR)_3 + ROH$ (1)

$HO\text{-}Si(OR)_3 + H_2O \leftrightarrow (HO)_2Si(OR)_2 + ROH$ (2)

$(HO)_3SiOR + H_2O \leftrightarrow Si(OH)_4 + ROH$ (3)

$\equiv Si\text{-}OR + HO\text{-}Si\equiv \leftrightarrow \equiv Si\text{-}O\text{-}Si\equiv + ROH$ (4)

$\equiv Si\text{-}OH + HO\text{-}Si\equiv \leftrightarrow \equiv Si\text{-}O\text{-}Si\equiv + H_2O$ (5)

$Si(OR)_4 + 4H_2O \leftrightarrow Si(OH)_4 + H_2O$ (6)

$Si(OH)_4 \rightarrow SiO_2 + 2H_2O$

THIN FILM ANTENNA AND THE METHOD OF FORMING THE SAME

FIELD OF THE INVENTION

The present invention generally relates to an antenna, and especially to a film antenna.

DESCRIPTION OF THE PRIOR ART

Recently, wireless transmission is widely used around the world, and most wireless transmission devices such as a cell phone, a PDA, and a DTV (digital TV) etc., need receiving devices to receive transmitted signals. Because of the digitalization of the transmission of information, information such as audio signals, video signals, etc, may be processed easily by the device such as a personal computer, a mobile device, etc. And audio and video codec technology can further improve the compression of the band of aforementioned information. Digital communication and digital broadcast can produce the environment which can transfer the aforementioned information to a terminal device easily and effectively, for example, transfer AV (audio and video) information to a portable phone.

Wireless transmission uses the antenna standing out externally to exchange the signals between the devices. RF circuits, cables and antennas are usually manufactured on a particularly designed substrate. It is very important to maintain the control of the characteristics of impedance in response to the special application of these circuits, thus, the length of the cable and the antenna is the key of elements for design. Two important keys which may influence the effect of the material of the substrate are the dielectric constant (sometimes called "relative dielectric constant") and the dielectric loss (sometimes called "dissipation factor"), wherein the dielectric constant can determine the transmitting velocity of which signals transmitting in the substrate, and the corresponding length of the cable and other components applied on the substrate for transferring signals. And dielectric loss is the loss caused by signals transferring in the substrate, and the loss will increase when the frequency increases.

A printed circuit cable, a passive circuit, and an emitting component for a RF circuit is usually formed by one of three following methods. The first one is the structure of micro-strip which configures a cable on a plate surface and provides a conductive layer generally called grounding layer. The second one is the structure of buried micro-strip. It is similar to the first structure besides its cable of signals is covered by a dielectric substrate. The third one is the structure of the strip-line with the cable of signals sandwiched between two conductive layers (grounding layers) and the antenna configured on the main surface of the printed circuit board. For vehicle applications, most of solutions are using a whippy antenna configured on the roof of the vehicle. And compared to recent trends of vehicle design, these antennas are embedded in the structure of vehicles to reduce the influence on beauty and aerodynamics of the vehicle. Additionally, integrating several kinds of telecommunication services into a single antenna may reduce manufacturing costs. The Bands which antennas can receive include: bands of FM (Frequency Modulation), PHS (Personal Handyphone System), Wireless car aperture, System For Mobile (GSM 900, GSM 1800), CDMA (Code Division Multiple Access), GPRS (General Package Radio Service), Bluetooth, WLAN (Wireless Local Area Network) and DTV.

The frequency is limited to the characteristics of the antenna such that the multi-frequency operation is not proper, thus, some structures of antenna can only be operated in a default band. And materials of the antenna are not more than metal or alloy, if the antenna is formed on the glass, it will influence the visibility. Additionally, most of current antennas use electroplating process to manufacture planar antennas, wherein the electroplating liquid may cause environmental pollution, and the cost of the metal bulk material is higher.

SUMMARY OF THE INVENTION

The present invention relates to a film antenna with following characteristics.

In one aspect, the present invention provides a method for manufacturing the film antenna. The main step includes driving a substrate to move horizontally by a roll to roll device, forming the material of the antenna by physical sputtering, deposition or evaporation to facilitate to form a film on the substrate driven by the roll to roll device, followed by applying the film of the antenna with mechanical force or etching or laser to produce the antenna pattern, wherein the material of the antenna is selected from the group consisting of gold, zinc, silver, palladium, platinum, rhodium, ruthenium, copper, iron, nickel, cobalt, tin, titanium, indium, aluminum, tantalum, gallium, germanium and antimony and the combination thereof. The material of the antenna may also include non-metallic oxides, such as indium tin oxides or zinc oxides, and conductive polymers. The aforementioned method for manufacturing the film antenna includes heating the film of the antenna and/or increasing the surface energy of the film of the antenna. The pattern of the antenna includes monopole, dipole, log periodic antennas, dual-spiral, fractal or inverted F pattern, rectangle, peak shape, line, triangle, hexagon, round, trapezoidal, comb-like, notched or dendritic.

In other embodiments, the characteristics of the method for manufacturing the film antenna include providing a soft (flexible) substrate with the film of the antenna adhered on, and the film of the antenna on the soft (flexible) substrate is made by the method of sputtering, physical deposition, evaporation, coating, spraying; applying the film of the antenna with mechanical force or etching or laser power to generate the pattern of the antenna. In order to increase the cohesion between them or the flatness of the substrate, a buffer layer can be made between the substrate and the film of the antenna. And the aforementioned substrate is driven to move horizontally by the roll to roll device such that the film of the antenna is formed on the soft substrate.

The device for manufacturing the film antenna of the present invention includes a power source for physical sputtering, depositing or evaporating to facilitate to perform the process of sputtering, depositing, or evaporating particles or gas; a roll to roll device for driving the substrate to move horizontally, and coating the film of the antenna on the substrate by physical sputtering, depositing or evaporating. The aforementioned device for manufacturing the film antenna further comprises a heating device, a vacuum pump.

In another aspect, the present invention discloses a manufacturing method of thin film antenna, comprising preparing gel, followed by coating the gel on a substrate to form a transparent thin film. Thermal process is performed to heat the thin film. The gel includes vinyl oxide and metal compounds, wherein the vinyl oxide includes PEO having In(NO)$_3$.3H$_2$O, In(Ac)$_3$, SnCl$_2$.2H$_2$O, or Sn(C$_2$O$_4$) contained thereof, and the metal compounds include indium, tin compounds. The substrate includes PCB, ceramics, polymers, glass or fiber.

In another embodiment, the present invention discloses a method for manufacturing the film antenna, which comprises: forming inorganic polymers and preparing gel by the inorganic polymers; performing thermal process to heat the thin film. The precursor includes alk-oxides, inorganic salts and organic salts. The gel includes $SiO_2$, $TiO_2$ and/or $ZnO_2$. The inorganic salts include chloride and/or nitrate, and the organic salts include acetate.

The advantage of the present invention is that the expensive metal raw material is omitted, so the film antenna made by the non-metallic material through Sol-Gel and coating is lighter, smaller, and costs less and can be manufactured easier so as to protect the environment. The aforementioned method can also be used to manufacture a transparent electrode of a touch panel or a monitor.

DESCRIPTION OF THE PREFERRED EMBODIMENT

The present invention discloses a film antenna for a vehicle, an electric device, or a portable device. The antenna is manufactured on a flexible substrate which is different from typical substrates of the antenna. Thus, the substrate with flexibility may facilitate to be adhered to an irregular surface or uneven surface, and is suitable for the rolling process of the present invention. In order to increase the cohesion between them or the flatness of the substrate, a buffer layer is provided between the substrate and the film of the antenna. The substrate for the film of the antenna mentioned above is driven to move horizontally by a roll to roll device such that the film of the antenna is formed on the flexible substrate, and the velocity of rolling may be used to control the thickness of which the film grows. The aforementioned antenna may use physical deposition, sputtering, evaporation, inkjet printing, coating, spraying.

Figure 1:
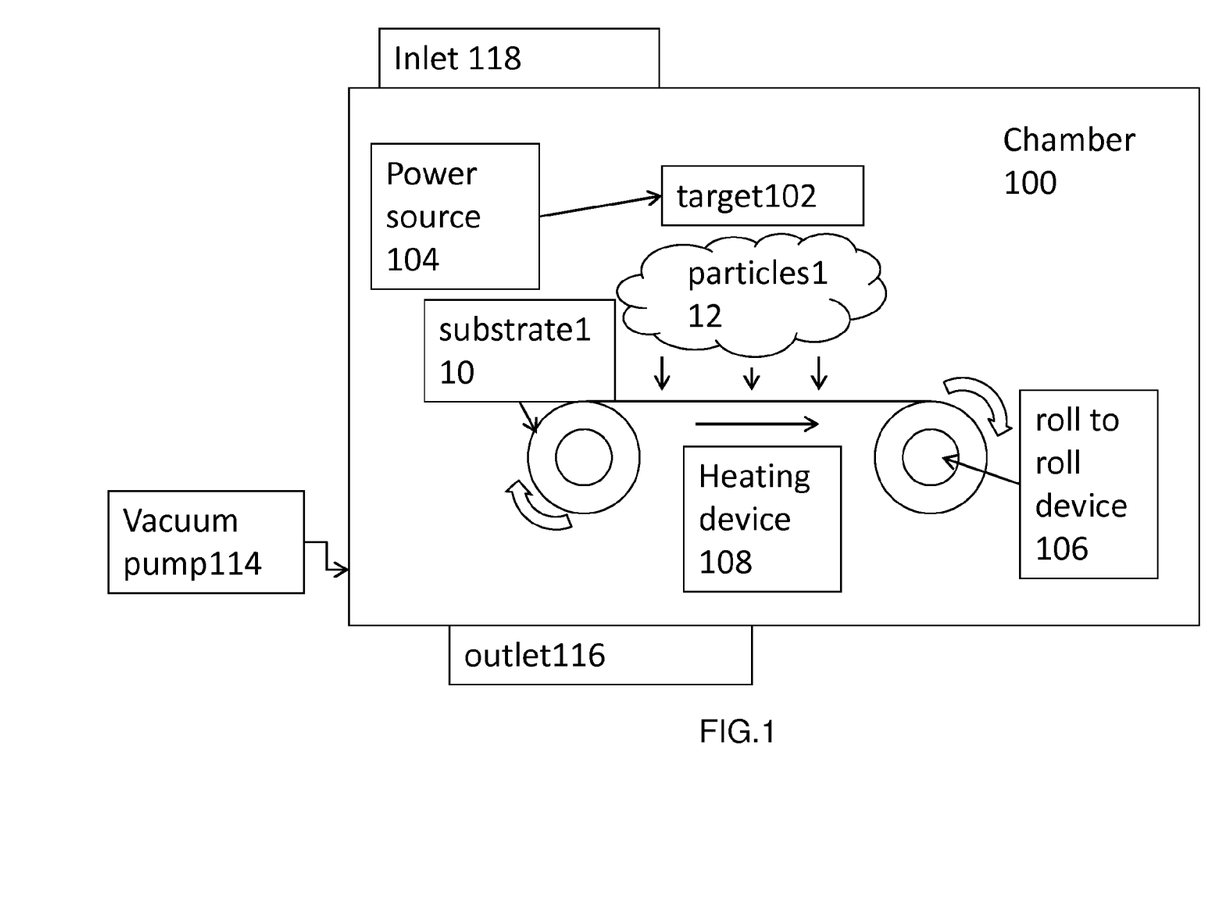
FIG. 1 shows the device for manufacturing the antenna of the present invention.

In an embodiment, the device for manufacturing the film antenna of the present invention includes: a chamber or a process chamber 100, wherein a target of the antenna 102 is configured and a power source 104 for physical sputtering or deposition is configured to bombard the target physically which facilitates to form physical sputtering or PVD (physical vapor deposition). The method of PVD may include an electron gun, laser, a plasma source, and the physical sputtering may use RF-sputtering, DC-sputtering. Evaporating which may also be used to produce the film includes a boiler loading the material to be heated so as to form gas. A roll to roll device 106 is configured in the chamber 100 corresponding to the target or under it. The roll to roll device 106 may drive the flexible or soft substrate to move by a driving device, such as a motor or the like, which can drive the roll to roll device 106 to rotate around an axis, such as the arrow direction shown in FIG. 1, followed by rolling the substrate 110 from one end to another. In the process, the substrate 110 will be driven to move horizontally (such as the horizontal arrow shown in the figure), and in the process of deposition, evaporation, and sputtering, material particles 112 (the material forming the antenna) will be deposited or plated on the substrate 110 which moves horizontally. The velocity of rolling (or the rolling rate of the roller) can be controlled, thereby controlling the horizontally moving velocity, such that the thickness of the material of the antenna can be further controlled. A heating device 108 configured under the substrate moving horizontally may be optionally launched to provide a heat source for forming the film of antenna. In order to facilitate the process of evaporating, sputtering, or deposition, a vacuum pump 114 connected to the chamber 100 is used to reduce the pressure of the chamber 100 such that a suitable degree of vacuum can be reached, such as 0.0001-0.1 torr. In order to facilitate the import and export of gas, the chamber 100 is also configured with an inlet 118 and an outlet 116. The preferable material of the substrate 110 is the material with soft or flexibility, such as PET, PC, PVC, PI, PMMA, polymers or Flexible board. The heating device 108 may include a lamp, electromagnetic radiation, or an infrared heater. The target 102 may use conductive carbon, wherein the conductive carbon contains CNT (carbon nano-tube) and can also be selected from the group consisting of gold, zinc, silver, palladium, platinum, rhodium, ruthenium, copper, iron, nickel, cobalt, tin, titanium, indium, aluminum, tantalum, gallium, germanium and antimony and the combination thereof. Indium tin oxides, indium zinc oxides, or conductive polymers can also be used as the material of the target of the antenna.

The pattern of the antenna includes single-pole, dipole, logarithmic or inverted F antenna pattern. The pattern of the antenna also includes fractal, rectangle, peak shape, line, triangle, hexagon, round, trapezoidal, comb-like, notched or dendritic. The fractal component is the configuration of the basic fractal patterns overlapped at least once. The aforementioned overlapped configuration which is to put basic fractal patterns on the substrate pattern by one of the following methods, which includes rotation, extension, and translation or the combination thereof, may be configured to a handheld device, a mobile phone, a notebook, a PDA, a portable device, a vehicle, a NFC (Near Field Communication) application. The antenna of the aforementioned device which may be configured on the outer or inner surface of the shell of the device includes a shielding structure positioned between the antenna and the circuit board. And some conductive materials made by the method are transparent, and if the antenna is adhered to a glass or a window, it will provide a penetrating vision. And the antenna can also be adhered to the shell of the bulb of the vehicle because the transparency of the shell is lower than the window, thus, the present invention can be formed on the shell of the bulb of the vehicle. Additionally, the antenna, which can be formed on the shell or the screen of a notebook or a mobile phone and so on, may prevent the shielding effect. In this case, the conductive layer is usually made by metal oxides, wherein the metal is preferable one or more metals selected from the group consisting of gold, zinc, silver, palladium, platinum, rhodium, ruthenium, copper, iron, nickel, cobalt, tin, titanium, indium, aluminum, tantalum, gallium, germanium and antimony. The material of the transparent antenna such as indium tin oxides or indium zinc oxides can be blended with aluminum oxides ($Al_2O_3$). A feed-in structure can be accomplished by a capacitance coupled, which is well known in the art, and it can improve the receiving system by using space-diversity or polarization variability. Two or more high-frequency antennas or an antenna array can be used here, and the advantage of the present invention is that the plurality of the antennas adhered to the same transparent window can contain different structures with less costs. The feed-in structure is well known in the art, and other structures of the high-frequency antenna can also be applied in the same field and spirit of the present invention. The antenna is presented in different structures (such as arrays with different turning directions). When the polarization variability is used to compensate the loss of signals caused by the transmitting environment being changed quickly, a polygon can be chosen to be an alternative shape as the structure of the substrate. The material of the transparent conductive film such as indium zinc oxides and indium tin oxides can use an ion-beam assisted sputtering system and install a high-energy ion source such that the substrate can be cleaned and modified in the coating process and a preferable cohesion of the film can be obtained. The ion-beam assisted mechanism can also be used as auxiliary energy to increase kinetic energy of the highly-coated atom, such that the deposited film may form a microstructure of the film structure with high-density, high uniformity and continuity.

Figure 2:
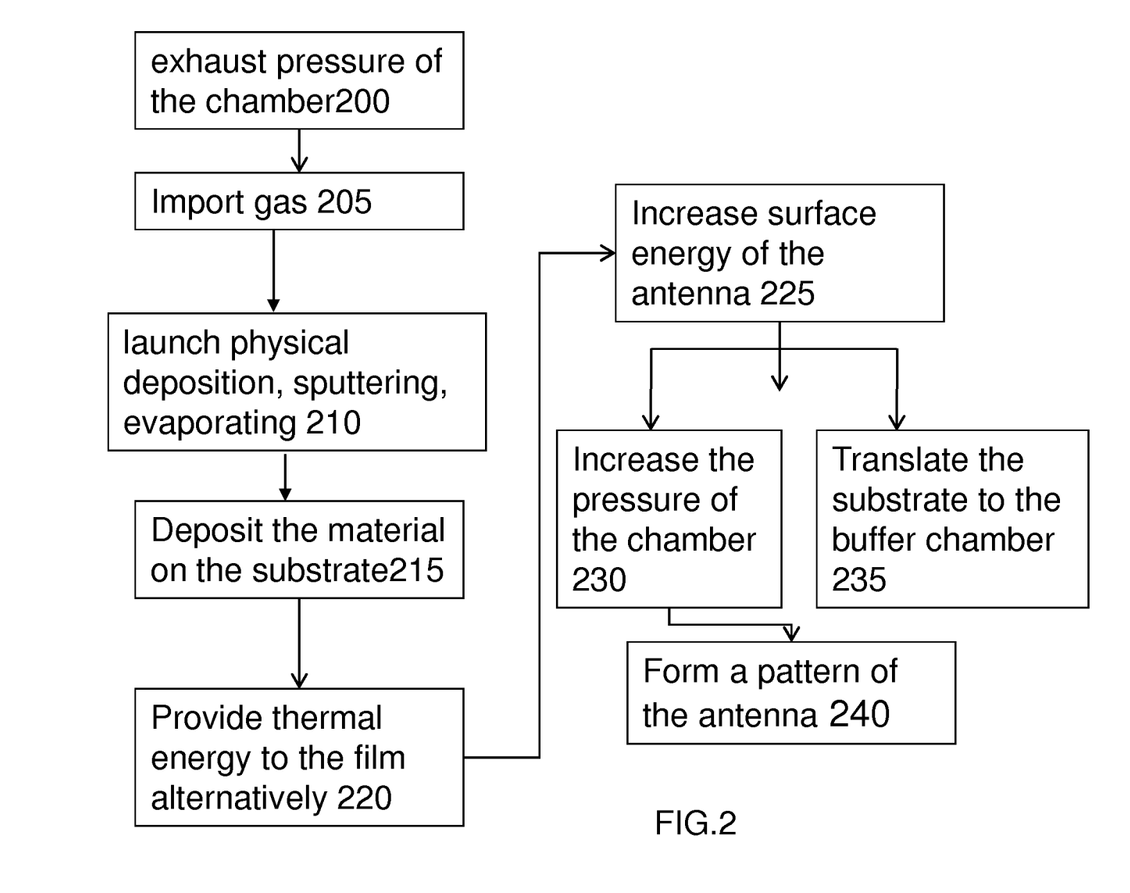
FIG. 2 shows the method for manufacturing the antenna of the present invention.

The process forming the transparent antenna of the present invention can form a film structure at low temperature, for example, the film may be formed at room temperature and its transparency may be higher than 82%. The temperature of the process may be controlled between the room temperature and 200° C., and if PET is selected to be as the soft substrate, it can be manufactured at the room temperature to reduce the costs of the heating process. FIG. 2 shows the manufacturing steps of the present invention. At first, the target 102 is located in the chamber 100 at a suitable site, and the air of the chamber is exhausted by the vacuum pump 114 to a pre-determined degree of vacuum so as to reduce the impurity, referred to the step 200. Next, desired gas is imported which referred to step 205 if necessary, and then the step of PVD, sputtering, or evaporation 210 is performed to produce particles or gas for forming the antenna on the substrate in the chamber, and the roll to roll device 106 is employed to drive the substrate to move horizontally, and control the rolling velocity to control the moving velocity of the substrate, and deposit or coat the material of the antenna on the surface of the substrate, referred to the step 215. Therefore, the present invention can use a large number of methods of deposition, evaporation, or sputtering to deposit the material of the antenna on the substrate which is driven by the roll to roll device 106 which is driven to move horizontally. In pace with the development of the process, the substrate translate from one end which is not deposited to another end, and the substrate which has been deposited or sputtered will be rolled to the end. The substrate can be curled at another end due to its flexibility. If necessary, the heating device can be launched to provide desired thermal energy for the film of the antenna, referred to the step 220, or to provide surface energy for the film of the antenna, referred to the step 225. Then, translate the substrate with the film of the antenna to the buffer chamber and rise the pressure to the normal pressure and take the substrate out (step 235) or rise the pressure to the normal pressure and take out directly (step 230). At this point, the curled film of the antenna has been completed. Then, expand the curled film of the antenna according to the demand, and compress it with a machine and cut it with a tool to stamp a desired pattern of antenna which can also be etched or cut by laser power to form the desired pattern, referred to the step 240. If necessary, a buffer layer can be coated on the soft substrate.

The present invention may use a non-metallic material for the antenna. Using the non-metallic material may benefit lighter and smaller device, and lower the costs, and make the devices being mass production. The aforementioned non-metallic antenna is referred to the antenna of which the body of the antenna without raw metal materials, not referred to the antenna of which the body of the antenna without metal additives, or particles. A large number of the films of the antennas can be made by the substrate which can roll over the roll to roll device by its flexibility without electroplating solution such that the environment will not be polluted. The thickness of the film growing can be controlled by the driven velocity (or rolling rate) of the shaft. The substrate of the film antenna can be adhered to an irregular or uneven surface because of its flexibility. Besides, a traditional antenna of a handheld device is configured on the printed circuit board, it may easily cause the interference between electronic components. However, the antenna can be moved away from the circuit board according to the present invention. If the antenna is transparent, it can be adhered to the outer surface of a screen or a glass. A shielding structure can be positioned between the antenna and the circuit board to avoid the interference between the antenna and the components of the circuit board when the antenna is adhered to the inner surface or the outer surface of the shell of the handheld device.

The antenna can be made with conductive polymers or carbon nanotubes. The conductive polymers made by which are selected from the group consisting of thiophenes, selenophenes, tellurophenes, pyrroles, anilines, polycyclic aromatics, may include but not be limited to polythiophenes, poly(selenophenes), poly(tellurophenes)), polypyrroles, polyanilines, polycyclic aromatic polymers, etc. U.S. Patent Application 20080017852 to Huh; Dal Ho et al. has disclosed "Conductive Polymer Composition Comprising Organic Ionic Salt and Optoelectronic Device Using the Same" which is related to the method for manufacturing conductive polymers, incorporated as a reference. In another embodiment, the conductive polymers may be the organic polymer semiconductor or the organic semiconductor. The pattern of polyacetylenes includes polyacetylene, polypyrrole, polyaniline and the derivatives thereof. The conductive organic polymers usually have extended delocalized bonds which may cause the band structure which is similar to silicon but has localized states. The conductive polymers with zero-band gap have behaviors of the metalloid. The carbon nanotubes may include multi-walled carbon nanotubes, single-walled carbon nanotubes; the following literature which may be incorporated as reference is: Young's modulus in the low TPa range and tensile strengths in excess of 37 GPa, please refer to the Articles: Yakobson et al., Phys. Rev. Lett. 1996, 76, 2411; Lourie et al., J. Mater. Res. 1998, 13, 2418; Iijima et al., J. Chem. Phys. 1996, 104, 2089 o Generally, the CNT (carbon nano-tubes) include mutually entangled nanofibers to form, and one of the methods for forming the aforementioned CNT is to infuse organic molecules through the tangled CNT, such that the nanotube networks will be formed. Then, process the organic molecules by polymerization and heat process to produce a mutually mesh-like structure or nanofibers of CNT.

Figure 3:
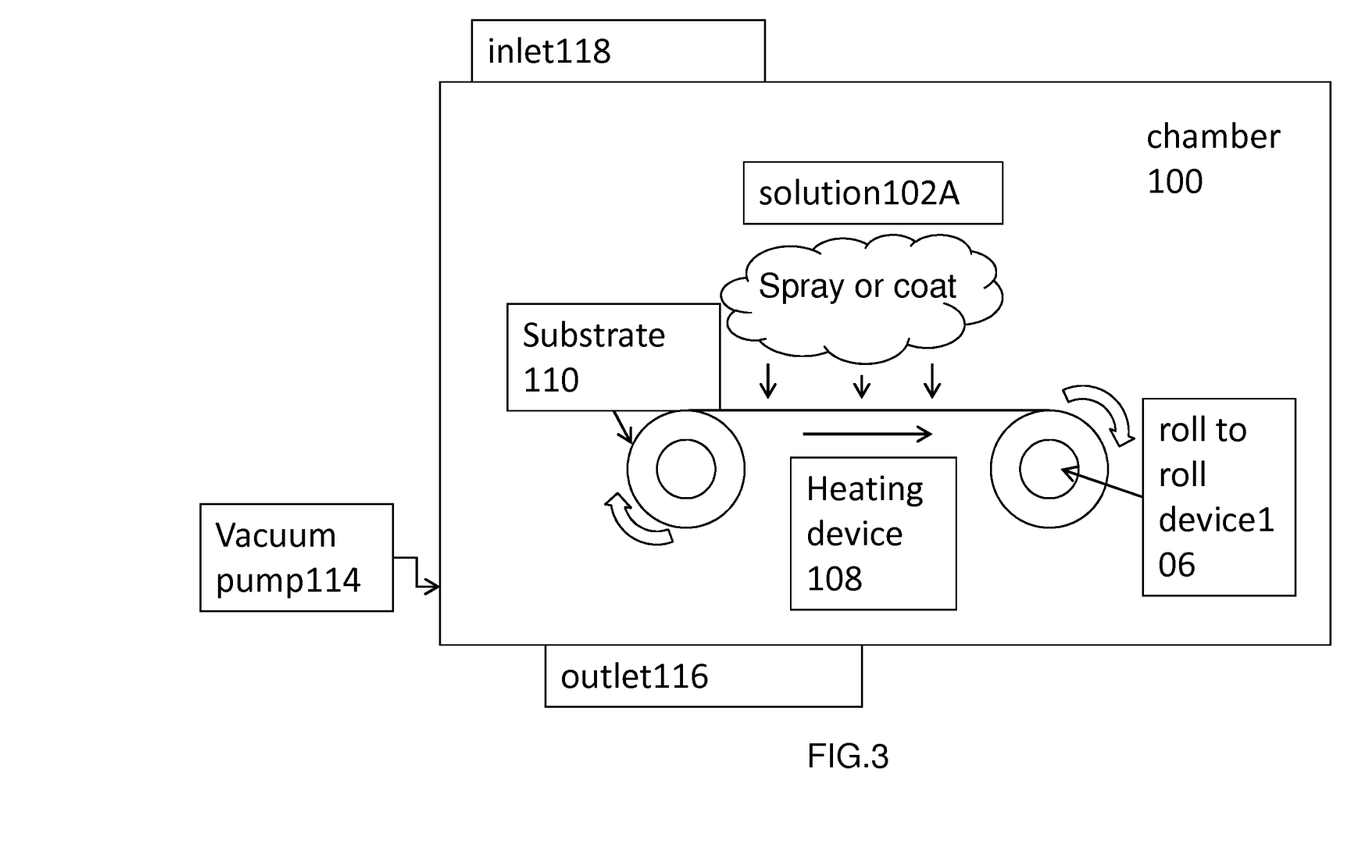
FIG. 3 shows the device for manufacturing the antenna of the present invention.
Figure 4:
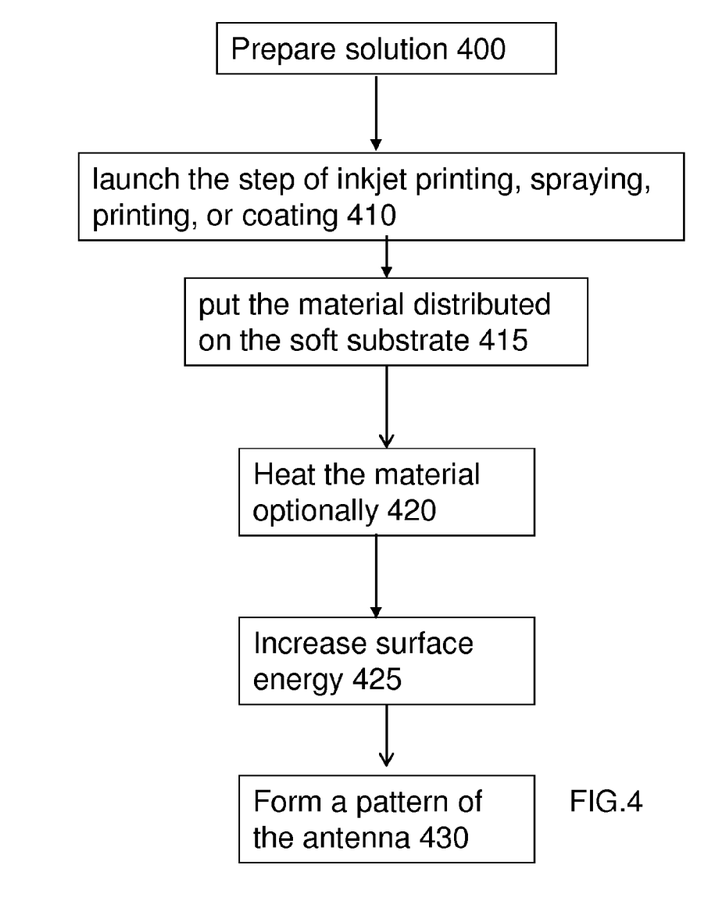
FIG. 4 shows the method for manufacturing the antenna of the present invention.

Based on the costs of manufacture, the method for forming the film of the antenna such as indium tin oxides may be performed in the moist air at room temperature in the embodiment. After the film is formed or patterned, the heat process is performed between 50° C. and 220° C. to reduce the resistance and increase the transparency. The embodiment is referred to FIG. 3 and FIG. 4. At first, prepare the solution of the indium-tin oxide or the zinc oxide 400 which can be made by diluting the powder of the material in the solution blended with alcohol and water, and perform the heat process at the temperature higher than 100° C. A thinner can be added in the diluting process, such as ferrous sulfate, trisodium citrate, tartaric acid, and sodium boron hydride. The device of the embodiment is similar to the device in FIG. 1 and FIG. 2, and the difference is that the embodiment uses coating, spaying, or inkjet printing to coat the solution on the desired soft substrate. After preparing the solution, launch the step of inkjet printing, spraying, printing, or coating 410 and distribute the material on the flexible substrate 415, and the pattern of the antenna may be sprayed on the soft substrate directly if the method of inkjet printing is used. Other steps which are similar to the embodiments mentioned above contain heating optionally 420, increasing the surface energy 425, followed by cutting and manufacturing the unit of the antenna. The conductive film may be made by applying the liquid mentioned above on the substrate, followed by drying it to obtain a transparent film. The metal solution may be configured by blending a dispersant.

In another aspect, the present invention discloses a film antenna. A preferable embodiment includes a transparent conductive pattern formed on an object. A protecting layer can be coated on the transparent conductive pattern if necessary. The object may contain the substrate of a handheld device or a shell, a displaying surface, a windshield, a rearview window, or a window of a building, etc. In an embodiment, a power source may be coupled to the structure of the antenna alternatively to provide thermal energy or electricity, such that the fog or moisture on the glass may be removed from the transparent conductive pattern. The impedance of the antenna input is matched, wherein the feed-in conductive cable is made by the cable with the impedance such as 300 ohms, 50 ohms or 75 ohms.

The material of the conductive pattern includes metal oxides, wherein the metal is preferable one or more metals selected from the group consisting of gold, zinc, silver, palladium, platinum, rhodium, ruthenium, copper, iron, nickel, cobalt, tin, titanium, indium, aluminum, tantalum, gallium, germanium, antimony. And some conductive materials made by the method are transparent, and if the antenna is adhered to glass, it will provide visual penetration. Or, the antenna may formed in the shell or on the screen of GPS, a wireless mouse, a wireless keyboard, a remote control, a notebook or a mobile phone, etc, such that the shielding effect may be reduced. The receiving system may be improved by using space-diversity or polarization variability. Two or more antennas may be used, too. And the advantage of the present invention is that the plurality of the antennas adhered to the same transparent window can contain different structures with less costs. The feed-in structure is well known in the art, and other structures of the high-frequency antenna can also be applied in the same field and spirit of the present invention.

Figure 5:
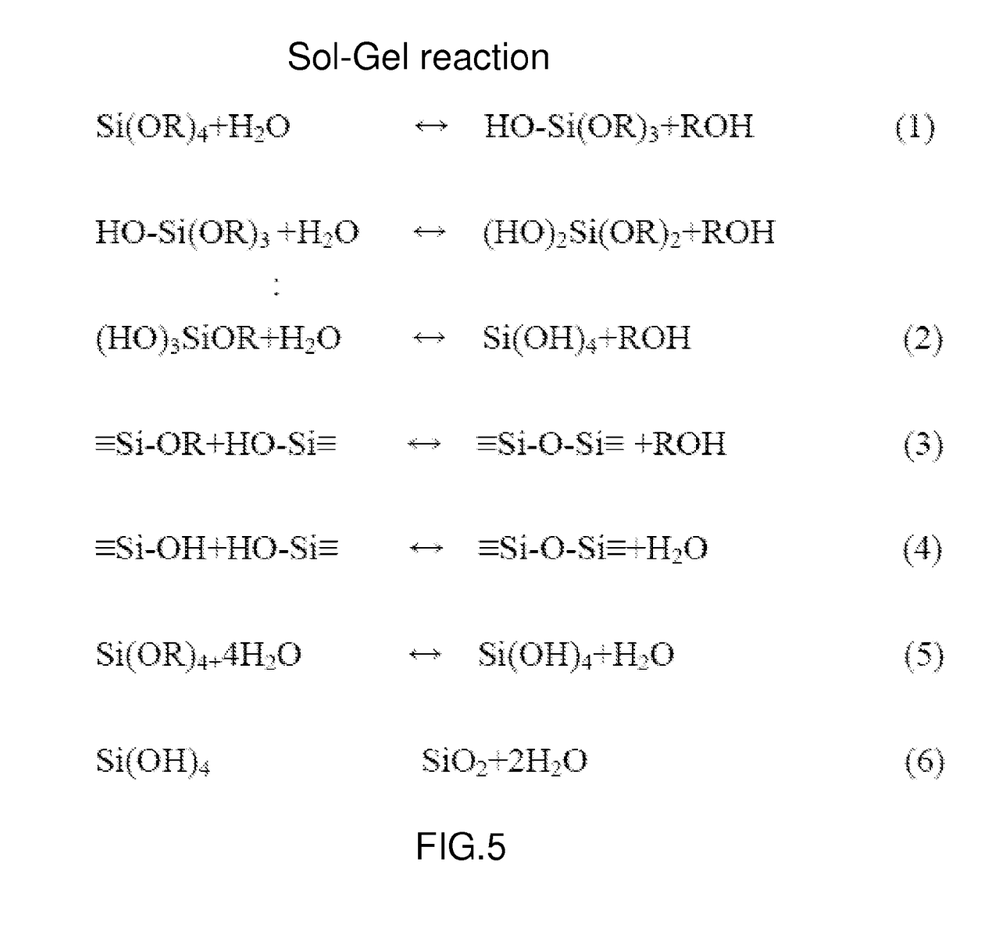
FIG. 5 shows the Sol-Gel reaction.
Figure 6:
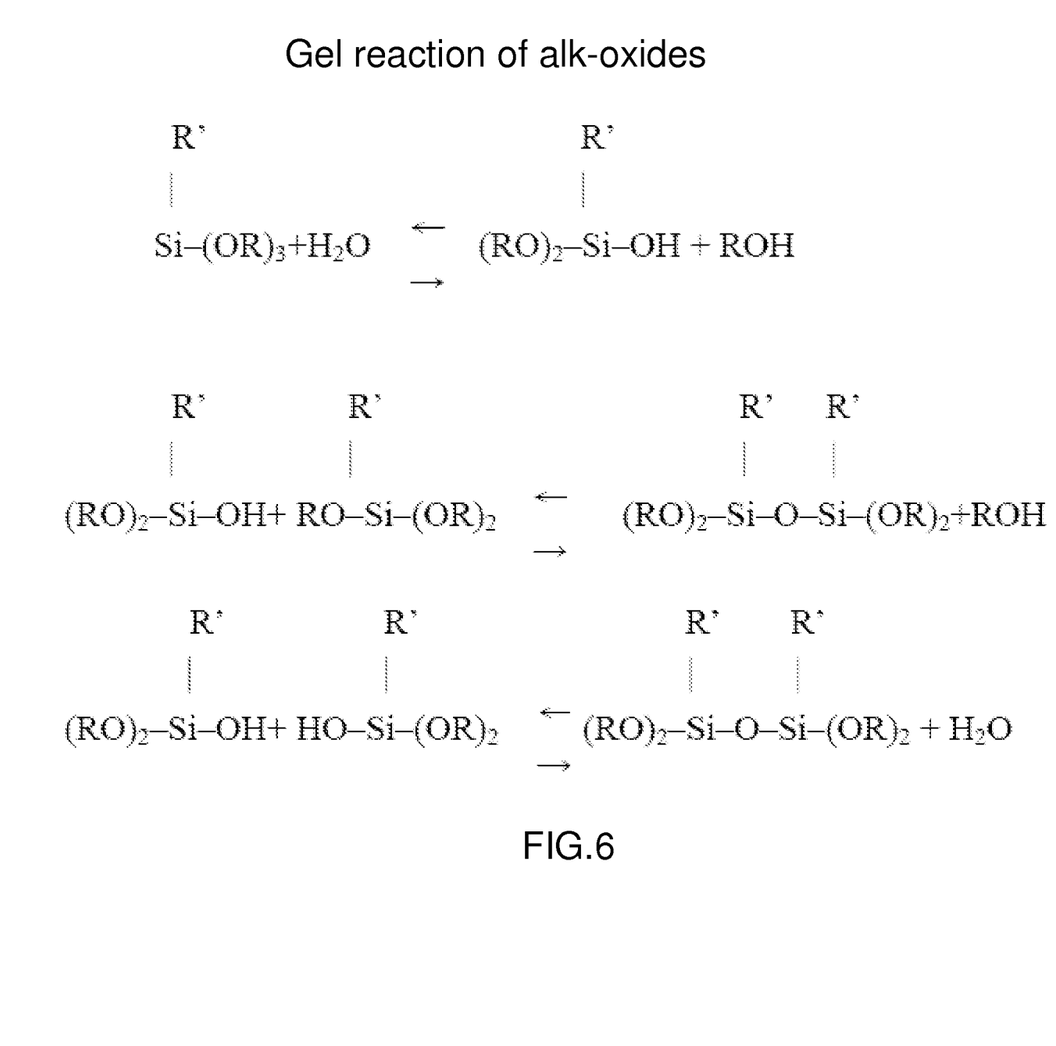
FIG. 6 shows the gel reaction of alk-oxides.

The manufacturing method of the antenna includes preparing a substrate which comprises PCB, ceramics, polymers, glass, fiber (such as paper fiber), etc, and PET with flexibility which can endure the temperature up to 100° C. is preferred. Then, the coating solvent is prepared, which includes the following steps:

forming inorganic polymeric network;

transforming the inorganic polymeric network to gel at the temperature under the melting point of the oxide;

The precursor may be alk-oxides [M(OR)n, Rx-M(OR)n-x]; inorganic salts (such as chloride, nitrate); organic salts (such as acetate, acetylacetonate). The procedure mentioned above includes transforming the solution to the gel; and the displacement of the alk materials, referred to FIG. 5 and FIG. 6.

$TiO_2$ is made by Sol-Gel and spin coating, and different proportion of APTMS ($SiO_2$) which is added as the adhesive may increase the contact area between the particles of $TiO_2$ so as to reduce the internal resistance and thin the crystallites. Adding the electrode of $TiO_2$ with 5 wt % APTMS provides a preferable photoelectric conversion when the contact area between the particles of $TiO_2$ gets larger. In one embodiment, coating solution of the antenna can be made by the procedure mentioned above. The precursor mentioned above may include $Si(OC_2H_5)_4$, $Ti(OC_2H_5)_4$ and/or $Zr(OC_3H_7)_4$; the initial component of the solution includes: alk-oxides:alcohol=1:18-20, alk-oxides:water=1:1-2, which is preferred is alk-oxides:alcohol:water=1:19.3:1.85 with pH-3.5. $SiO_2$—$TiO_2$ and $SiO_2$—$ZrO_2$ can be made by the method mentioned above. The spin coating of which the speed is 2000 rpm can be used as the method of coating.

In another embodiment, In-oxides can be obtained in $In_2O_3$. A ITO film can be made by spin coating the solution of ITO sol-gel which is made by processing In-oxides and Sn. The manufacturing embodiment includes blending the solution of 10 wt % and 5 wt % PEO (poly(ethylene oxide)) and In, Sn compounds, such as $In(NO)_3.3H_2O$, $In(Ac)_3$, $SnCl_2.2H_2O$ or $Sn(C_2O_4)$, followed by processing with thermolysis at the temperature between 450° C. and 600° C. The mole proportion of the precursor is about 9:1 (In/Sn).

After drying it, the pattern of the antenna can be made by cutting or impressing; the pattern of the antenna can also be made by screen printing with coating. The substrate with solution of the pattern on the surface which is processed from room temperature to 90° C. may dry the solution to obtain a transparent conductive layer. Then, thermal process is performed at the temperature which is higher than 100° C., such as the temperature between 180° C. and 220° C. in about one to three hours or emit electromagnetic radiation to reduce the resistance of the film and increase the transparency.

The present invention discloses a structure of an antenna adhered to at least one surface of a window, glass or a windshield. A cable may be coupled to the pattern of the structure of the antenna by ohmic contact or a capacitance or the mechanism of conductive coupling. A dehumidification power which is coupled to the structure of the antenna through the cable may provide thermal energy to the pattern to remove the moisture or fog on the glass or window. Therefore, in some cases, the structure may include a dual function as a device for receiving signals and removing the fog or moisture.

In other embodiments, the materials of the embodiments mentioned above may include conductive polymers, conductive carbon, or conductive glue to increase the conductivity. The device will get lighter, smaller, cost less (without metal raw materials which are expensive), and the process will be simplified. For example, copper which is traditionally used is heavy and expensive. In contrast, the present invention uses the non-metallic material for the antenna. The non-metallic antenna mentioned above is referred to the antenna of which the main body of the antenna does not use raw metal materials, and not referred to the antenna without metal additives, or particles.

The aforementioned materials may be made by pad printing of which the process is much easier and may not pollute the environment, and a traditional antenna using etching or electroplating may cause the pollution of the environment to deteriorate. And the film antenna can be adhered to an irregular or uneven surface. Besides, a traditional antenna of a handheld device is configured on the printed circuit board, it may easily cause the interference between electronic components. However, the antenna can be moved away from the circuit board according to the present invention. If the antenna is transparent, it can be adhered to the outer surface of a screen or a glass.

In an embodiment, the conductive polymers made by the precursor monomer selected from the group consisting of thiophenes, selenophenes, tellurophenes, pyrroles, anilines, polycyclic aromatics are used, which may include but not be limited to polythiophenes, poly(selenophenes), poly(tellurophenes)), polypyrroles, polyanilines, polycyclic aromatic polymers, etc. U.S. Patent Application 20080017852 to Huh; Dal Ho et al. has disclosed "Conductive Polymer Composition Comprising Organic Ionic Salt and Optoelectronic Device Using the Same" which is related to the method for manufacturing conductive polymers, incorporated as a reference. In another embodiment, the conductive polymers include the organic polymer semiconductor or the organic semiconductor. The pattern of polyacetylenes includes polyacetylene, polypyrrole, polyaniline and the derivatives thereof. The conductive organic polymers usually have extended delocalized bonds which may cause the band structure which is similar to silicon but has localized states. The conductive polymer with zero-band gap has behaviors of the metalloid. The conductive gel may include at least one kind of glass, metal particles, and additives, wherein the glass is selected form the group consisting of $Al_2O_3$, $B_2O_3$, $SiO_2$, $Fe_2O_3$, $P_2O_5$, $TiO_2$, $B_2O_3/H_3BO_3/Na_2B_4O_7$, PbO, MgO, $Ga_2O_3$, $Li_2O$, $V_2O_5$, $ZnO_2$, $Na_2O$, $ZrO_2$, $TlO/Tl_2O_3/TlOH$, NiO/Ni, $MnO_2$, CuO, AgO, $Sc_2O_3$, SrO, BaO, CaO, Tl, ZnO. The additives may include oleic acid. The antenna may include different shapes. The inverted F antenna can be referred to US. Patent Application 20080001826, filed at Jul. 3 2007. A conductive electrode for solar energy may also be made by the embodiments mentioned above. The structure of the antenna can be configured in a handheld device, a mobile phone, a notebook, a PDA, a portable device, a vehicle, a NFC application.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for manufacturing a film antenna, which includes: blending a solution having PEO (poly(ethylene oxide)) and In, Sn compounds, followed by processing with thermolysis at a temperature between 450° C. and 600° C.; driving a substrate to move by a roll to roll device, and forming a film of an antenna on said driven substrate by coating, inkjet printing or spraying said solution having PEO (poly(ethylene oxide)) and In, Sn; providing a heating device to provide a heat source for reducing a resistance of said film and increasing transparency, wherein said heating device include a lamp, electromagnetic radiation, an infrared heater or the combination thereof to reduce a resistance of said film and increase transparency; and applying mechanical force, etching, or laser power on said film of said antenna to generate a pattern of said antenna.

2. The method according to claim 1, wherein said In, Sn compounds includes $In(NO)3.3H_2O$, $In(Ac)_3$, $SnCl_2.2H_2O$ or $Sn(C_2O_4)$.

3. The method according to claim 1, wherein said film of said antenna includes indium tin oxides.

4. The method according to claim 1, wherein said film of said antenna further includes conductive polymers or carbon nanotubes.

5. The method according to claim 1, wherein said substrate includes PET, PC, PVC, PI, paper fiber or PMMA.

6. The method according to claim 1, further comprising forming a buffer layer between said substrate and said film of said antenna.

7. A method for manufacturing a film antenna, which includes: blending a solution having PEO (poly(ethylene oxide)) and In, Sn compounds, followed by processing with thermolysis at a temperature between 450° C. and 600° C.; driving a substrate to move by a roll to roll device, and applying said solution having PEO (poly(ethylene oxide)) and In, Sn on said substrate driven by said roll to roll device through coating, inkjet printing or spraying; providing a heating device to provide a heat source for reducing a resistance of said film and increasing transparency, wherein said heating device include a lamp, electromagnetic radiation, an infrared heater or the combination thereof.

8. The method according to claim 7, wherein said In, Sn compounds includes $In(NO)3.3H_2O$, $In(Ac)_3$, $SnCl_2.2H_2O$ or $Sn(C_2O_4)$.

9. The method according to claim 7, wherein said film of said antenna includes Indium tin oxides.

10. The method according to claim 7, wherein said film of said antenna further includes conductive polymers or carbon nanotubes.

11. The method according to claim 7, wherein said substrate includes PET, PC, PVC, PI, paper fiber or PMMA.

12. The method according to claim 7, further comprising forming a buffer layer between said substrate and said film of said antenna.

* * * * *